United States Patent
Chatterjee

(10) Patent No.: US 10,608,110 B2
(45) Date of Patent: Mar. 31, 2020

(54) I-SHAPED GATE ELECTRODE FOR IMPROVED SUB-THRESHOLD MOSFET PERFORMANCE

(71) Applicant: Texas Instruments Incorporated, Dallas, TX (US)

(72) Inventor: Amitava Chatterjee, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/679,908

(22) Filed: Aug. 17, 2017

(65) Prior Publication Data

US 2017/0345929 A1 Nov. 30, 2017

Related U.S. Application Data

(62) Division of application No. 14/846,398, filed on Sep. 4, 2015, now Pat. No. 9,768,296, which is a division
(Continued)

(51) Int. Cl.
 *H01L 29/78* (2006.01)
 *H01L 21/28* (2006.01)
 (Continued)

(52) U.S. Cl.
CPC .... *H01L 29/7833* (2013.01); *H01L 21/28123* (2013.01); *H01L 21/31051* (2013.01);
(Continued)

(58) Field of Classification Search
CPC ....... H01L 29/78; H01L 31/08; H01L 21/336; H01L 21/338; H01L 21/20; H01L 21/44; H01L 27/14; H01L 21/331

USPC .......... 257/292, 288, E29.255, E31.052, 257/E21.409, 734, 773, E21.411; 438/197, 926, 618, 183, 584, 597, 672, 438/666, 151
See application file for complete search history.

(56) References Cited

U.S. PATENT DOCUMENTS

| 2001/0011753 | A1 | 8/2001 | Nishida et al. |
| 2002/0048972 | A1* | 4/2002 | Yamaguchi ....... H01L 29/41733 257/734 |

(Continued)

FOREIGN PATENT DOCUMENTS

CN 102683416 A 9/2012

OTHER PUBLICATIONS

SIPO Search Report, CN Appl. No. 201310481541.6, dated Jun. 15, 2017.
(Continued)

*Primary Examiner* — Mouloucoulaye Inoussa
(74) *Attorney, Agent, or Firm* — Jacqueline J. Garner; Charles A. Brill; Frank D. Cimino

(57) ABSTRACT

Metal-oxide-semiconductor (MOS) transistors with reduced subthreshold conduction, and methods of fabricating the same. Transistor gate structures are fabricated in these transistors of a shape and dimension as to overlap onto the active region from the interface between isolation dielectric structures and the transistor active areas. Minimum channel length conduction is therefore not available at the isolation-to-active interface, but rather the channel length along that interface is substantially lengthened, reducing off-state conduction.

12 Claims, 8 Drawing Sheets

Related U.S. Application Data of application No. 13/651,783, filed on Oct. 15, 2012, now abandoned.

(51) Int. Cl.

| | |
|---|---|
| H01L 29/423 | (2006.01) |
| H01L 21/3105 | (2006.01) |
| H01L 21/762 | (2006.01) |
| H01L 29/06 | (2006.01) |
| H01L 29/08 | (2006.01) |
| H01L 29/49 | (2006.01) |
| H01L 29/66 | (2006.01) |
| H01L 21/8238 | (2006.01) |

(52) U.S. Cl.
CPC .... *H01L 21/76224* (2013.01); *H01L 29/0649* (2013.01); *H01L 29/0847* (2013.01); *H01L 29/4238* (2013.01); *H01L 29/42356* (2013.01); *H01L 29/42376* (2013.01); *H01L 29/495* (2013.01); *H01L 29/4916* (2013.01); *H01L 29/4966* (2013.01); *H01L 29/66568* (2013.01); *H01L 21/823828* (2013.01)

(56) References Cited

U.S. PATENT DOCUMENTS

| | | | |
|---|---|---|---|
| 2005/0023608 | A1 | 2/2005 | Chan et al. |
| 2005/0087764 | A1 | 4/2005 | Inoue et al. |
| 2012/0080741 | A1 | 4/2012 | Watanabe et al. |
| 2014/0042506 | A1* | 2/2014 | Ramberg .......... H01L 27/14614 257/292 |

OTHER PUBLICATIONS

Joly et al., "Temperature and Hump Effect Impact on Output Voltage Spread of Low Power Bandgap Designed in the Sub-threshold Area", International Symposium on Circuits and Systems (IEEE, May 2011), pp. 2549-2552.

Thakar et al., "High Performance 0.3 um CMOS using I-Line Lithography and BARC", Digest of Technical Papers, Symposium on VLSI Technology (IEEE, 1995), pp. 75-76.

Thakar et al., "A Manufacturable High Performance Quarter Micron CMOS Technology Using I-Line Lithography and Gate Linewidth Reduction Etch Process", Digest of Technical Papers, Symposium on VLSI Technology (IEEE, 1996), pp. 216-217.

Reimbold, "Modified 1/f Trapping Noise Theory and Experiments in MOS Transistors Biased from Weak to Strong Inversion—Influence of Interface States", Trans. Electron Devices, vol. ED-31, No. 9 (IEEE, 1984), pp. 1190-1198.

Chang et al., "Flicker Noise in CMOS Transistors from Subthreshold to Strong INversion at Various Temperatures", Trans. Electron Devices, vol. 41, No. 11 (IEEE, 1994), pp. 1965-1971.

Williams et al., "Hydrodynamic Simulations of a Nanoscale RingFET", Paper FA8-06, Int'l Semiconductor Device Research Symp. (IEEE, Dec. 7, 2011).

Singh et al., High-Performance Fully Depleted Silicon Nanowire (Diameter <5 nm) Gate-All-Around CMOS Devices, Elec. Device Letters, vol. 27, No. 5 (IEEE, 2006), pp. 383-386.

Lee et al., "Gate Oxide Thinning Effects at the Edge of Shallow Trench Isolation in the Dual Gate Oxide Process", Paper ST5-06, 6th Int'l Conf. on VLSI and CAD (IEEE, 1999), pp. 249-252.

Kleinpenning, "On 1/f Trapping Noise in MOST's", Trans. Elec. Dev., vol. 37, No. 9 (IEEE, 1990), pp. 2084-2089.

\* cited by examiner

I-SHAPED GATE ELECTRODE FOR IMPROVED SUB-THRESHOLD MOSFET PERFORMANCE

CROSS-REFERENCE TO RELATED APPLICATIONS

This application is a divisional of U.S. patent application Ser. No. 14/846,398, filed Sep. 4, 2015, which is a divisional of U.S. Nonprovisional patent application Ser. No. 13/651,783, filed Oct. 15, 2012 (now Abandoned), the contents of both of which are herein incorporated by reference in its entirety.

STATEMENT REGARDING FEDERALLY SPONSORED RESEARCH OR DEVELOPMENT

Not applicable.

BACKGROUND OF THE INVENTION

This invention is in the field of integrated circuits. Embodiments of this invention are more specifically directed to metal-oxide-semiconductor (MOS) transistors.

Many modern electronic devices and systems now include substantial computational capability for controlling and managing a wide range of functions and useful applications. As is fundamental in the art, reduction in the size of physical feature sizes of structures realizing transistors and other solid-state devices enables greater integration of more circuit functions per unit "chip" area, or conversely, smaller chip area consumed for a given circuit function. The capability of integrated circuits for a given cost has greatly increased as a result of this miniaturization trend.

As is fundamental in the art, a MOS transistor ideally conducts very low drain current at gate-to-source voltages below the transistor threshold voltage. Subthreshold leakage current, which is the drain current conducted by a MOS transistor under drain-to-source bias but at gate voltages below the threshold voltage, is generally undesirable in digital circuits, particularly in applications that are sensitive to power consumption, such as mobile devices, implantable medical devices, and other battery-powered systems. In recent years, certain analog circuits, such as voltage reference circuits, implement MOS transistors that are biased in the subthreshold region by design, so as to conduct low levels of current at low power supply voltages, while still providing a stable output reference voltage. In each of these circuit applications, minimal subthreshold conduction is desired.

Another non-ideal characteristic of MOS transistors is referred to in the art as "1/f" noise, or "flicker" noise, referring to frequency-dependent random variations in device drain current. Flicker noise generally appears in MOS transistors under both strong inversion (saturation) and weak inversion (subthreshold). MOS transistor flicker noise appears as deviations of circuit performance from design. For example, flicker noise in the signal processing and communications context appears as phase noise (i.e., random fluctuations in the phase of a periodic signal), or "jitter" when expressed in the time domain. It has been observed that analog circuits with subthreshold-biased MOS transistors are especially susceptible to flicker noise.

Advances in semiconductor technology in recent years have enabled the shrinking of minimum device feature size (e.g., the width of the gate electrode) into the deep sub-micron range. State of the art MOS transistor gate widths are now on the order of one-quarter micron. Especially in these sub-micron devices, subthreshold behavior is degraded by a mechanism commonly referred to as the inverse narrow width effect ("INWE"), in which the threshold voltage becomes lower with narrower channel width. It has been observed that this effect is concentrated at the edges of the transistor channel, specifically at the active-to-field edge underlying the gate electrode.

FIGS. 1a and 1b illustrate the construction of conventional n-channel MOS transistor 2 that is susceptible to the INWE. Transistor 2 is formed at an active region of the surface of semiconductor substrate 4, that active region surrounded by isolation dielectric structure 5. In the plan view of FIG. 1a, source/drain regions 6 are the visible portions of this active region, which also includes the surface of the substrate 4 underlying gate structure 8. Gate structure 8, which is typically formed of polycrystalline silicon, a metal, or a conductive metal compound, overlies gate dielectric 7 (FIG. 1b) at the surface of the active region and extends onto isolation dielectric structure 5. Gate dielectric 7 is typically formed of silicon dioxide, silicon nitride, a combination of the two, or in some cases is formed of a "high-k" material such as hafnium oxide. As fundamental in the art, the channel region of transistor 2 is defined by those locations of the active region underlying gate structure 8 between source and drain regions 6. For this n-channel example, source/drain regions 6 are heavily doped n-type portions at the surface of p-type substrate 4, formed in self-aligned manner relative to gate structure 8. The channel region underlying gate structure 8 remains p-type. In this example, transistor 2 has a wide channel region relative to its channel length, as established by the four segments of gate structure 8 that extend across the active region. These four segments of gate structure 8 are connected in parallel by way of the contiguous end regions overlying isolation dielectric structure 5. As such, alternating ones of the source/drain regions 6 correspond to the source and drain, respectively, of transistor 2. Source/drain conduction in transistor 2 thus travels in a direction perpendicular to the longer axis of gate structure 8, shown in this example by channel CH. Contact locations 9 are shown in FIG. 1a, by way of which overlying metal conductors may contact source/drain regions 6 and gate structure 2 in the conventional manner.

FIG. 1b illustrates the cause of the INWE mechanism in transistor 2, by way of a cross-sectional view taken at the interface between the active region at the surface of substrate 4 and isolation dielectric structure 5, at the edge of the transistor channel underlying gate structure 8. Source/drain current is conducted in a direction into and out of the page of FIG. 1b. In this example, isolation dielectric structure 5 is of the type referred to in the art as shallow trench isolation (STI). STI structures are conventionally formed by etching recesses into the surface of the substrate at selected locations, depositing dielectric material such as silicon dioxide into those etched recesses, and then removing excess deposited dielectric (e.g., by chemical-mechanical polishing) to planarize the surface of the STI structures with the surface of neighboring active regions.

Due to the effects of conventional processes, deviation in the uniformity of gate dielectric 7 can be present at interface IF between the active region and its adjacent isolation dielectric structure 5. FIG. 1b illustrates this deviation in an exaggerated fashion, for purposes of this description. More specifically, a recess into the underlying structure is formed at interface IF, and is filled by gate dielectric 7 and gate structure 8. Gate dielectric 7 is typically locally thin in this recess at interface IF, as compared to the rest of the film. This deviation is often manifest in the electrical characteristics of transistor 2 as a lower conduction threshold, namely a lower threshold voltage and a higher current density for a given gate-to-source voltage, as compared with the rest of the channel of transistor 2. This lower conduction threshold is believed to be due to the thinner gate dielectric 7 at interface IF, and also by the "gate wraparound" effect as gate structure 8 dips into the recess at that location. The lowering of the conduction threshold is also referred to in the art as the "double hump" effect. This effect has been observed to be more prevalent in integrated circuits constructed with STI isolation, as opposed to other isolation techniques (e.g., local-oxidation-of-silicon, or "LOCOS"). Because this edge effect more strongly affects transistors with shorter physical gate width, the resulting degradation in electrical performance is classified as a result of INWE behavior.

In circuit implementations, the premature edge conduction at interface IF between the active region and isolation dielectric structure 5 is reflected in performance degradation in several ways. The increased current density and lower threshold voltage at the channel edge of course appears as a higher level of subthreshold conduction, especially at elevated temperature. Unlike subthreshold conduction in the main portion of the transistor channel, this edge conduction has been observed to have a lower body-effect coefficient than does the main part of the channel. As a result, an increased back-bias applied to the transistor body (i.e., well region in which transistor 2 is formed, or the substrate itself, as the case may be) will reduce the subthreshold conduction in the main part of the channel, but will have a much lesser effect relative to the edge conduction, allowing premature edge conduction to dominate the level of subthreshold conduction of transistor 2 under that bias condition. Analog circuits constructed with transistors with lower conduction threshold at channel edges due to this mechanism also exhibit a high level of flicker noise, especially at low gate voltage and with applied back bias.

Off-state leakage due to the edge effect described above exhibits a relatively high variance over a population of transistors. This large device-to-device variance is somewhat inherent due to nature of this mechanism, in which a significant fraction of the subthreshold channel current is conducting at the poorly controlled channel edge of interface IF. This dominance is particularly evident at subthreshold gate bias and with back bias applied to the body node, as current through the main channel is reduced under those conditions. Processes such as chemical-mechanical planarization (CMP) and wet oxide etch typically have a high process variation, randomize the INWE mechanism and thus cause significant mismatch among the transistors in a given integrated circuit. This device mismatch is especially problematic in those analog circuits that rely on good matching of device characteristics, such as low power bandgap voltage reference circuits, as described in Joly et al., "Temperature and Hump Effect Impact on Output Voltage Spread of Low Power Bandgap Designed in the Sub-threshold Area", *International Symposium on Circuits and Systems* (IEEE, May 2011), pp. 2549-52, incorporated herein by reference.

Fabrication techniques addressing the edge conduction effect described above are known in the art. One approach involves the formation of a thicker gate dielectric at the edges of the channel region, at the active-to-isolation interface. The gate dielectric over the rest of the channel away from this edge remains at its nominal thickness for the desired technology. The thicker gate dielectric "fence" at the interface suppresses source-drain conduction along the transistor channel edge, and also can eliminate the "gate wraparound" effect and the resulting enhanced subthreshold conduction. However, fabrication of such a dual gate dielectric structure is significantly more complicated than that for a gate dielectric of a single thickness, involving at least one additional photolithography process as well as an additional etch. Both of the additional lithography and etch processes, besides adding manufacturing cost, also increase process variability among transistors in the same integrated circuit, and from wafer to wafer. Significant chip area is also consumed by this approach, to maintain the original transistor drive characteristics. In many situations, it is in fact difficult to control the extension of the fence into the active region, which is especially costly as the tolerance and controllability of the fence becomes a significant fraction of the active area. As such, the thicker dielectric fence approach is generally not useful at deep submicron widths.

Another known approach addressing the effect of the lower conduction threshold at the active-to-isolation interface is shown in plan view in FIG. 1c. This example of transistor 2' is referred to in the art as a "ring-FET", in that its gate structure 8' has a ring shape in its portion overlying the active region. As such, the bulk of the channel region of transistor 2' is also in the shape of a ring, with one source/drain region 6s defined as the portion within the interior of ring-shaped gate structure 8', and the other source/drain region 6d defined as the portion of active region outside of gate structure 8'. This results in a channel region that has no edge at an active-to-isolation interface. Rather, because active-to-isolation interface IF is located at an edge of the active region so as to constitute a potential conduction path between portions of contiguous source/drain region 6d, which is necessarily at a uniform potential, no channel conduction occurs along interface IF that would significantly degrade subthreshold conduction performance, 1/f noise performance, or invoke the other effects described above relative to FIGS. 1a and 1b. However, it has been observed that fabrication of ring-shaped gate structure 8' is quite difficult, in that the dimensions of polysilicon structures of this shape are not as well-controlled as orthogonal rectangular shapes. For this reason, in the most advanced technologies, the shapes of polysilicon or metal gate structures are restricted to all be either horizontal or vertical (i.e., "north-south" or "east-west" in the layout), precluding ring-shaped gate shapes. Furthermore, it is difficult to derive compact computer models for current conduction in ring-FETs, and those models are not scalable, restricting the flexibility with which variable widths and lengths of MOS-FETS can be used during circuit design.

By way of further background, as described in Thakar et al., "High Performance 0.3 um CMOS using I-Line Lithography and BARC", *Digest of Technical Papers, Symposium on VLSI Technology* (IEEE, 1995), pp. 75-76, and in Thakar et al., "A Manufacturable High Performance Quarter Micron CMOS Technology Using I-Line Lithography and Gate Linewidth Reduction Etch Process", *Digest of Technical Papers, Symposium on VLSI Technology* (IEEE, 1996), pp. 216-17, both incorporated herein by reference, polysilicon gate structures that are patterned and etched with a "hammerhead" structure at their tip ends extending onto field oxide are known in the art, for avoiding narrowing of the polysilicon gate as it passes from the active region onto the adjacent field oxide, and "pull back" of the line end of the gate from the field oxide.

BRIEF SUMMARY OF THE INVENTION

Embodiments of this invention provide a transistor structure and method of manufacturing the same that avoids subthreshold conduction degradation due to gate dielectric thinning and other mechanisms at the active-to-isolation structure interface of the transistor channel edge.

Embodiments of this invention provide such a structure and method that ensures low variance in subthreshold conduction among a population of transistors.

Embodiments of this invention provide such a structure and method that is readily compatible with existing manufacturing processes and technology, and that can be realized with minimal increase in manufacturing cost.

Embodiments of this invention provide such a structure that lends itself to compact computer modeling, providing improved flexibility in the design process.

Other objects and advantages of embodiments of this invention will be apparent to those of ordinary skill in the art having reference to the following specification together with its drawings.

Embodiments of this invention may be implemented into a metal-oxide-semiconductor (MOS) integrated circuit, and a method of manufacturing the same, by constructing transistor gate structures with one or more central portions that extend in a first direction across an active region at a semiconducting surface of a body to define a transistor channel region of the active region. Each central portion of the gate structure has end portions that are widened relative to the width of the central portion itself, and that overlie the interface between the active region and its adjacent isolation dielectric structure. The overlapping end portions of the gate structure effectively increase the channel length for conduction along the active-to-isolation interface, thus reducing early turn-on of the transistor at subthreshold gate voltages, and reducing the extent to which conduction is dominated at the channel edge.

DETAILED DESCRIPTION OF THE INVENTION

This invention will be described in connection with its embodiments, namely as implemented into an integrated circuit including metal-oxide-semiconductor (MOS) transistors, as it is contemplated that the invention will be especially beneficial in such an implementation. However, it is contemplated that this invention can provide significant benefit when applied to many other integrated circuit structures and methods. Accordingly, it is to be understood that the following description is provided by way of example only, and is not intended to limit the true scope of this invention as claimed.

Figure 2A:
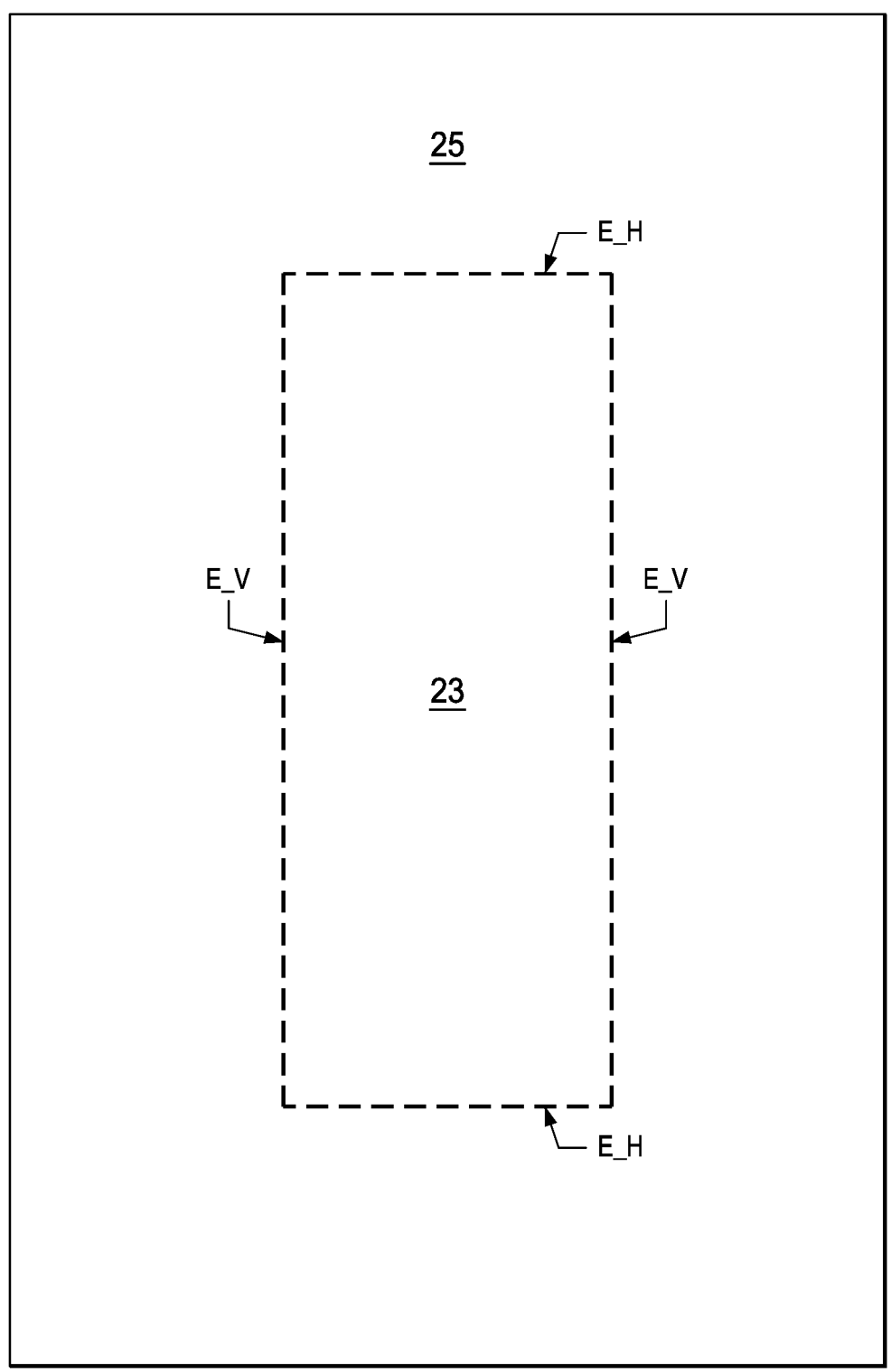
FIGS. 2a, 2b, and 2e are plan views.
Figure 2B:
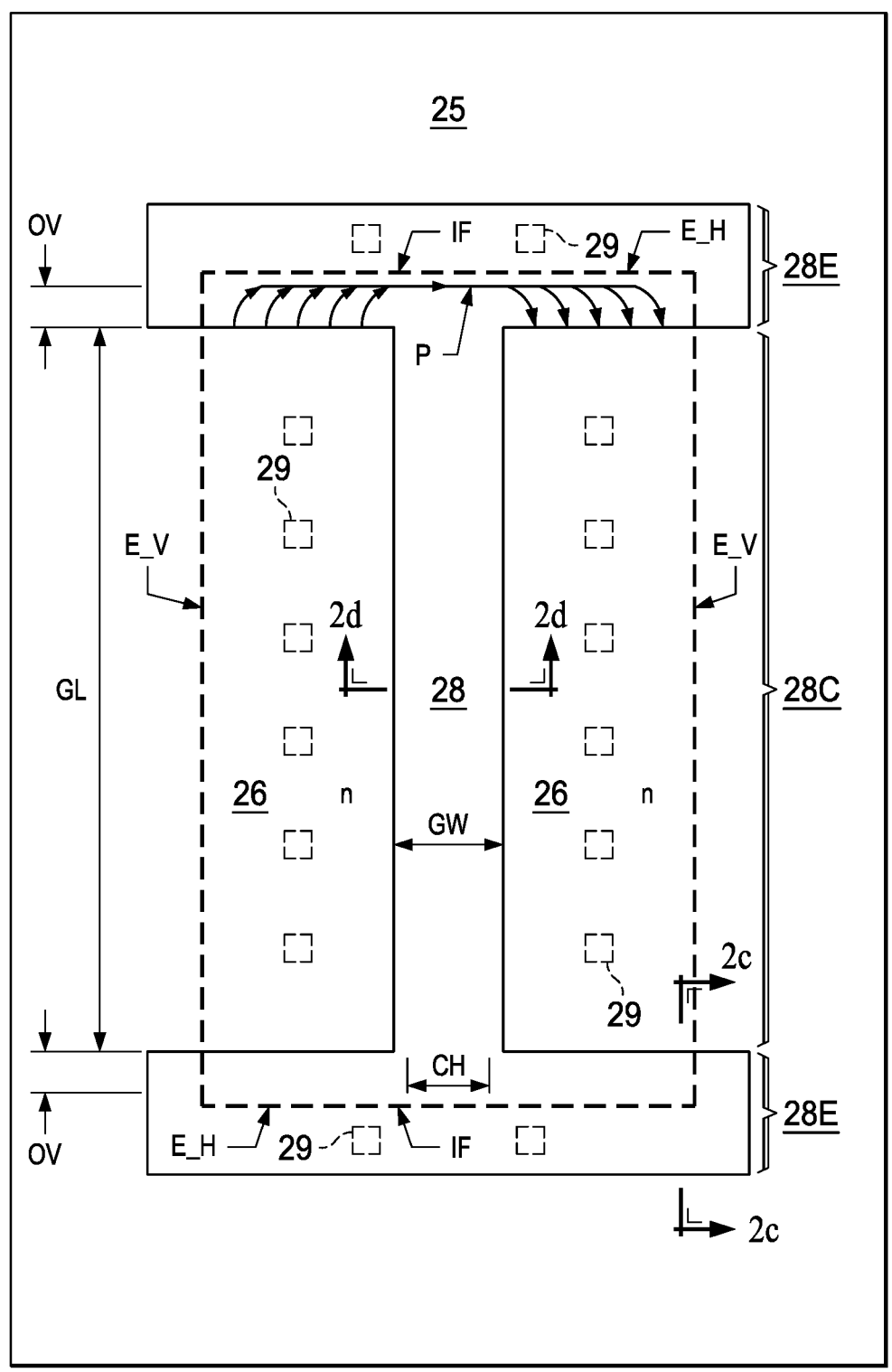
Figure 2C:
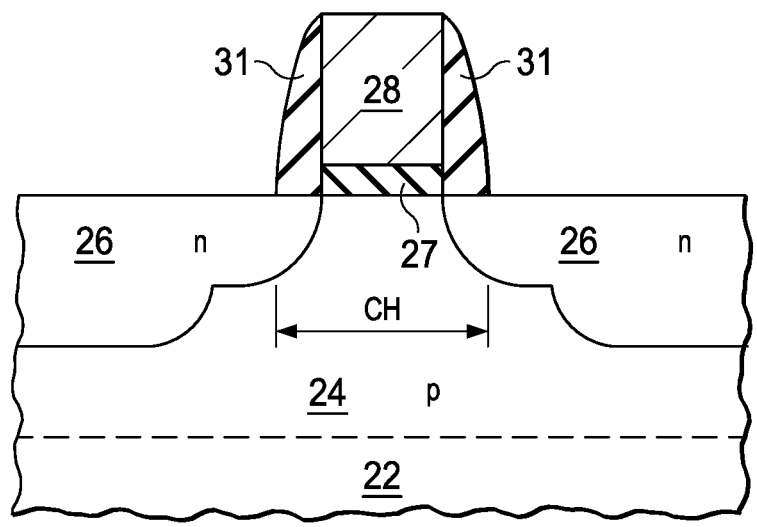
FIGS. 2c and 2d are cross-sectional views, of MOS transistors constructed according to embodiments of this invention.
Figure 2D:
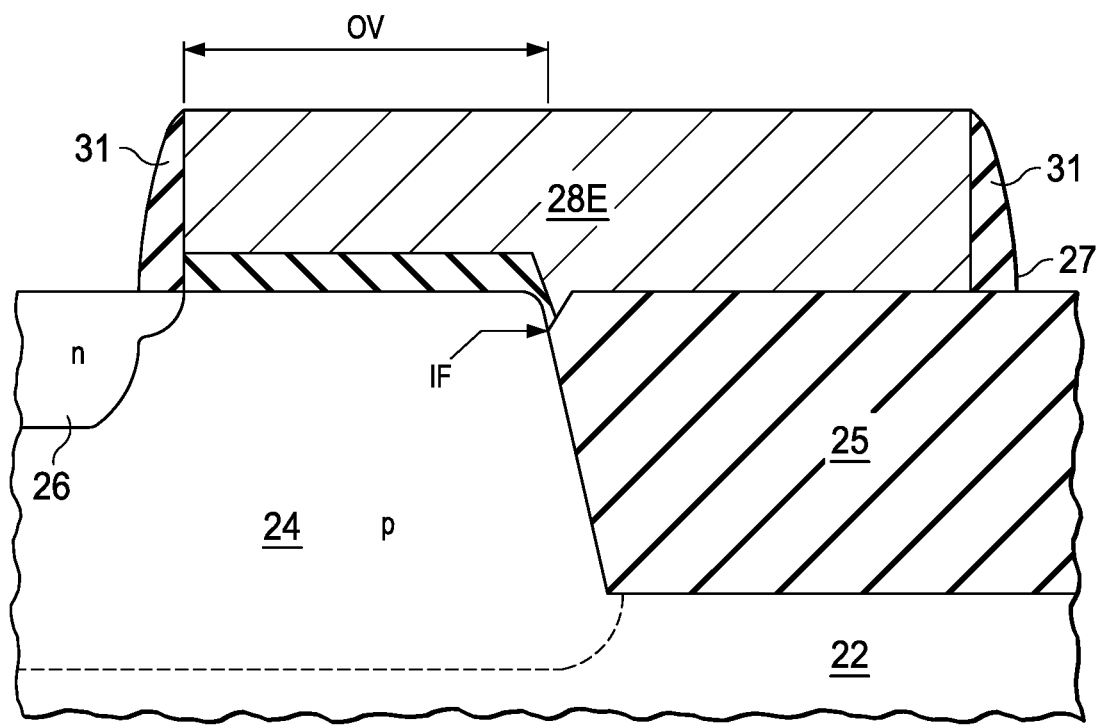

FIGS. 2a and 2b illustrate in plan view, and FIGS. 2c and 2d in cross-sectional views, the construction of transistor 20 according to embodiments of this invention. In this example, transistor 20 is a metal-oxide semiconductor (MOS) transistor formed at a selected location of the surface of single-crystal silicon substrate 22. More specifically, transistor 20 is an n-channel MOS transistor formed at active region 23 of the surface of p-well 26, that active region 23 being located between isolation dielectric structures 25 (or surrounded by a single such structure 25, depending on the larger-scale layout of the integrated circuit). In this example, isolation dielectric structures 25 are formed as shallow trench isolation (STI) structures. As known in the art, an STI structure consists of an element of dielectric material formed by deposition or the like into a recess etched into a surface of the semiconductor material at which transistors are to be formed; the term "shallow" is intended to convey that the isolation provided by the structure is the electrical isolation of the adjacent surface semiconductor regions on one side of the structure from semiconductor regions on the other side of the structure. Typically, shallow trench isolation structures are formed of a combination of a thermally grown silicon dioxide liner and a deposited (CVD) silicon dioxide fill, but may alternatively be formed of other dielectric materials. Active region 23, and other active regions in the same integrated circuit, at which transistors such as transistor 20 of FIGS. 2a through 2d are formed, are defined by those surface locations of the semiconductor material (e.g., substrate 22) at which isolation dielectric structures 25 are not present.

FIG. 2a illustrates a portion of the integrated circuit at which transistor 20 is to be formed, at a stage of manufacture of the integrated circuit prior to gate formation. As evident from FIG. 2a, active region 23 is defined as a generally rectangular area of the surface of substrate 22 in the interior of surrounding contiguous isolation dielectric structures 25. This rectangular arrangement is typical for modern integrated circuits fabricated using sub-micron technology, in which orthogonal rectangular feature shapes and orthogonal orientation of conductive facilitate dimensional control in manufacturing, and are also readily scalable. In this rectangular arrangement, the boundaries of active region 23 are parallel edges E_H extending in the horizontal direction (in the view of FIG. 2a) adjacent to isolation dielectric structures 25, and parallel edges E_H extending in the vertical direction; horizontal edges E_H are substantially perpendicular to vertical edges E_V in this rectangular arrangement, as shown.

Figure 1A:
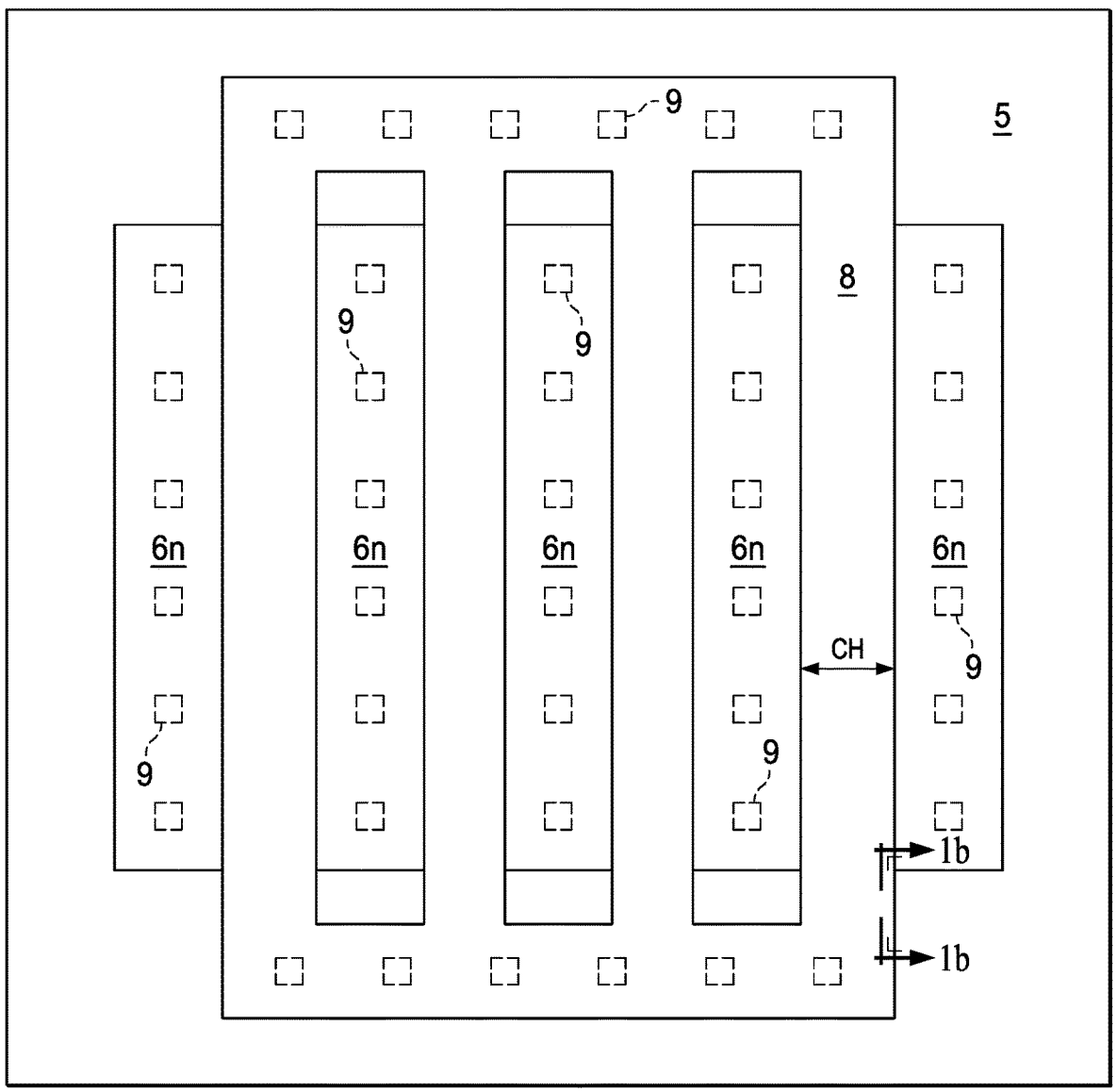
FIGS. 1a and 1c are plan views.
Figure 1B:
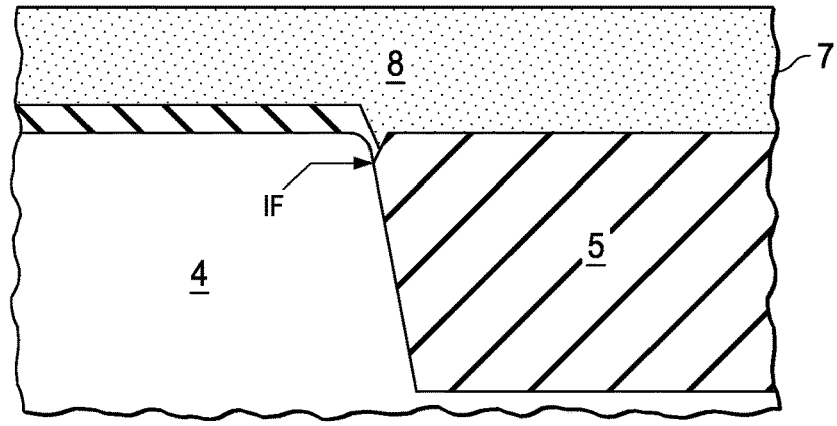
FIG. 1b is a cross-sectional view, of conventional metal-oxide-semiconductor (MOS) transistors.

Referring to FIGS. 2b through 2e, this example of transistor 20 is an n-channel MOS transistor formed into p-type well 24, which in this example is a doped region formed into substrate 22 by way conventional ion implantation and diffusion anneal. Alternatively, transistor 20 may be formed into substrate 22, absent a well region, for example as shown in the example of FIGS. 1a and 1b. Alternatively, transistor 20 may be formed at the surface of a semiconductor layer disposed over an insulating layer, according to conventional silicon-on-insulator (SOI) technology, or in other similar substrate structures as known in the art. As will be evident to the skilled reader having reference to this specification, embodiments of this invention are applicable to both n-channel and p-channel MOS transistors.

Gate structure 28 of transistor 20 overlies a portion of active region 23, and extends onto isolation dielectric structures 25 on either end, as shown in FIGS. 2b and 2d. Gate structure 28 in this embodiment of the invention may be formed of doped polycrystalline silicon material (n-type doped for this example of an n-channel transistor), or a metal or conductive metal compound, such as titanium, tungsten, tantalum, titanium nitride, tantalum nitride, tungsten nitride, or the like. Gate structure 28 overlies the surface of p-well 24, with gate dielectric 27 disposed therebetween. Gate dielectric 27 consists of a thin layer of a dielectric material such as silicon dioxide, silicon nitride, or a combination thereof; alternatively, gate dielectric 27 may be a "high-k" material such as $HfO_2$ or the like. Sidewall dielectric spacers 31 are optionally disposed on the sides of gate structure 28, for this example of transistor 20 having lightly-doped drain extensions.

Source/drain regions 26 are heavily doped n-type portions at the surface of p-well 24 in this embodiment of the invention. In this example, source/drain regions 26 are formed in a self-aligned manner relative to gate structure 28, and in part relative to sidewall spacers 31. As shown in FIG. 2b, contact openings 29 are located at source/drain regions 26, and at gate structure 28 (specifically at locations overlying isolation dielectric structures 25), by way of which overlying conductors (not shown) may contact these terminals of transistor 20 through overlying interlevel dielectric material (not shown).

The cross-sectional view of FIG. 2c illustrates the construction of transistor 20 transverse to the portion of gate structure 28. As evident from FIG. 2c, source/drain regions 26 are n-type doped regions extending from the surface of the structure into p-well 24. In this example, transistor 20 is of the lightly-doped drain type, in that the junction profiles of source/drain regions 26 adjacent to the edges of gate structure 28 are defined by sidewall spacers 31. As is well-known in the art, source/drain regions 26 are formed by a first ion implant process performed after definition of gate structure 28, followed by a second implant after formation of sidewall spacers 31. The first implant is generally of lower dose than the second implant, forming junctions with a graded profile between source/drain regions 26 and p-well 24 at the edges of gate structure 26.

Under the appropriate bias conditions, transistor 20 conducts current between opposing source/drain regions 26 in the direction indicated by arrow CH of FIG. 2c, in response to a gate-to-source voltage applied to gate structure 28 that exceeds the threshold voltage of transistor 20. As such the width of gate structure 28 between source/drain regions 26 defines the transistor channel length, and the length of active region 23 underlying gate structure 28, in a direction perpendicular to the direction of conduction (CH), defines the transistor channel width. The current drive of transistor 20 in its on-state is proportional to the ratio of channel width to channel length, as fundamental in the art.

In the embodiment of the invention illustrated in FIG. 2b, gate structure 28 has a shape that reduces undesirable subthreshold conduction along the interface between isolation dielectric structures 25 and the channel region underlying gate structure 28. In this embodiment of the invention, gate structure 28 has central portion 28C that overlies active region 23, and is contiguous with end portions 28E disposed at opposite ends of central portion 28C. Central portion 28C has a width GW in a direction parallel to the source/drain conduction channel (arrow CH) of transistor 20, and a length GL in a direction perpendicular to the conduction channel. End portions 28E each have a width that is significantly greater than width GW of central portion 28C. In the example shown in FIG. 2b, the width of each end portion 28E extends fully to overlap vertical edges E_V of active region 23, on opposite sides of source/drain regions 26 from central portion 28C (i.e., vertical edges E_V running substantially parallel to the length of central portion 28C). Alternatively, end portions 28E need not be so wide as to reach vertical edges E_V, however end portions 28E should be significantly wider than gate width GW, for example by at least about 50% of gate width GW on each side of the central portion 28C, to significantly lengthen the current path along interface IF as described below. Transistor 20' according to an example of this alternative construction is illustrated in FIG. 2e, including end portions 28E having a width greater than 50% of gate width GW on each side of central portion 28C, but not extending to the far edges of active region 23 as in FIG. 2b.

Figure 2E:
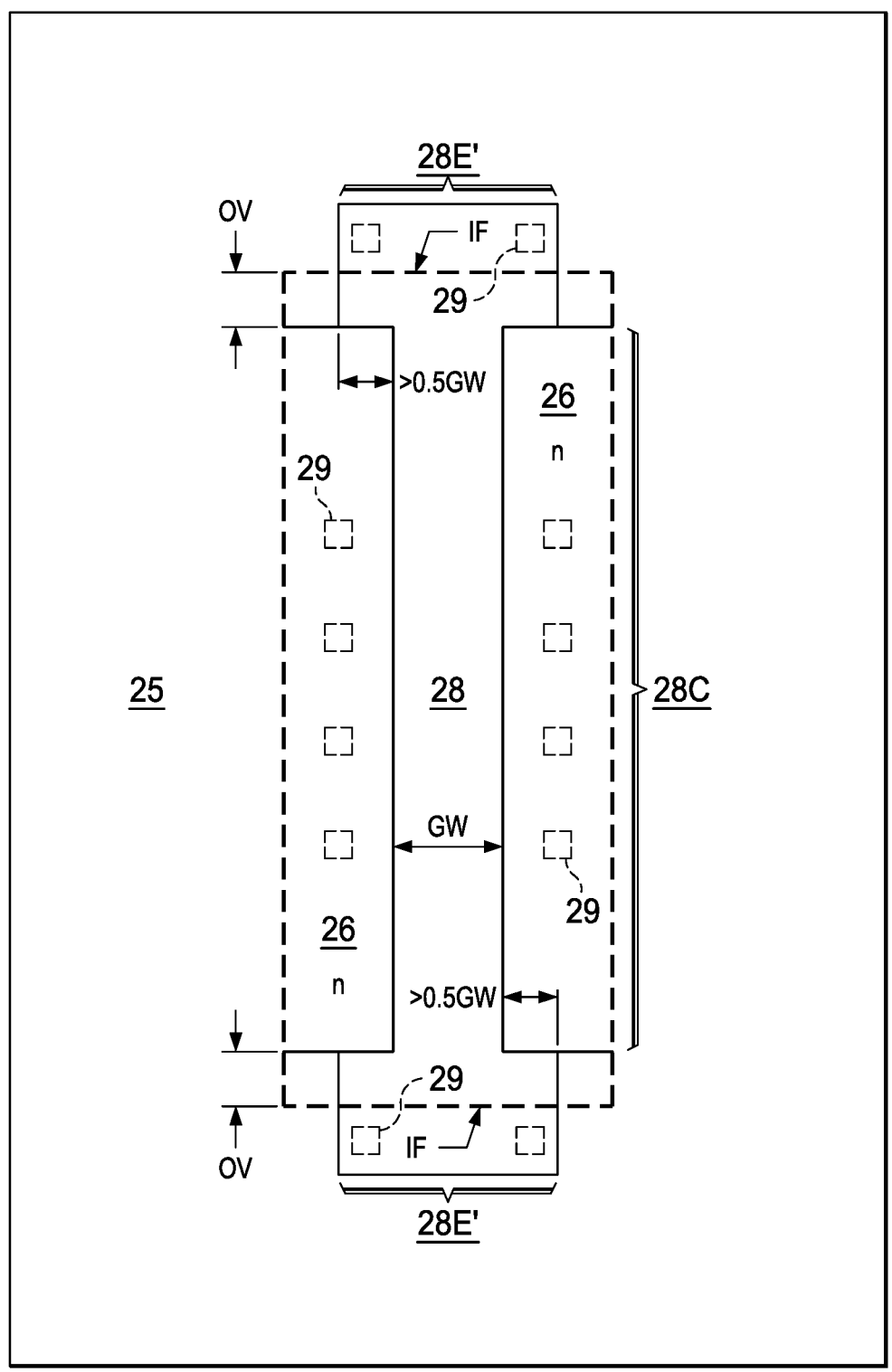

According to embodiments of the invention, as shown in both of FIGS. 2b and 2e, end portions 28E each overlap a corresponding one of horizontal edges E_H (i.e., horizontal edges E_H extending substantially perpendicular to the length of central portion 28C), at interface IF between isolation dielectric structures 25 and active region 23, by a distance OV. FIG. 2d illustrates overlap OV of end portion 28E of gate structure 28 by way of a cross-sectional view taken in a direction perpendicular to the cross-section of FIG. 2c. As evident from FIG. 2d, overlap OV of end portion 28E extends over the surface of p-well 24. The p-type surface of p-well 24 underlies end portion 28E (due to the subsequent self-aligned formation of source/drain regions 26 relative to gate structure 28), with gate dielectric 27 therebetween, as in the channel cross-section of FIG. 1b. Self-aligned source/drain region 26 begins at the edge of end portion 28E within active region 23, as shown.

As mentioned above and as fundamental in the art, the on-state current drive of a MOS transistor is generally proportional to the ratio W/L of channel width to channel length. Referring to the plan view of FIG. 2b, the channel width of transistor 20 is determined essentially by gate length GL of central portion 28C, with its channel length determined by gate width GW of this central portion 28C. While some finite amount of on-state current may conduct between source/drain regions 26 at the inverted surface of p-well 24 underlying end portions 28E, such conduction would be minimal considering that this conduction path (i.e., longer channel length) would be much longer and also much narrower (i.e., smaller channel width) than the channel underlying central portion 28C of gate structure 28. According to embodiments of this invention, it is contemplated that overlap OV of gate structure 28 onto active region 23 (i.e., the surface of well 24) will be at least about 50% of gate width GW, which will significantly lengthen any conduction path for current conducted along interface IF between active region 23 and isolation dielectric structure 25. It is therefore contemplated that on-state conduction under end portions 28E would generally be so small as to be insignificant.

In the subthreshold bias regime (i.e., gate-to-source voltage below the threshold voltage), overlap OV of gate structure 28 onto active region 23 serves to reduce subthreshold conduction along interfaces IF, according to embodiments of the invention. As discussed above in connection with FIGS. 1a and 1b, subthreshold conduction is facilitated at interface IF between active region 23 and isolation dielectric structure 25 due to thinning of gate dielectric 37, the wrap-around effect of gate structure 28 into the recess at interface IF, and because of an increased density of charge trapping sites at interface IF. According to embodiments of the invention, however, the location of interface IF is moved away from the primary channel of minimum channel length, by virtue of overlap OV of end portions 28E. As a result, the path for subthreshold conduction along interface IF is much longer than the channel length defined by gate width GW of central portion 28C. Charge conducted along interface IF must travel the distance OV under subthreshold bias from one source/drain region 26 to reach interface IF, and again travel the distance OV under subthreshold bias from interface IF to the opposite source/drain region. FIG. 2c illustrates an example of distributed conduction path P via interface IF. Accordingly, not only is this conduction path P substantially longer than the minimum channel length distance of conventional transistors, but this subthreshold conduction must also occur through two semiconductor portions away from interface IF. For both reasons, it is contemplated that subthreshold conduction and INWE threshold voltage degradation will be reduced to an insignificant level in transistors constructed according to embodiments of the invention, as compared with that of conventional transistors as described above relative to FIGS. 1a and 1b.

In addition, because subthreshold conduction at the isolation-to-active interface is significantly reduced according to embodiments of this invention, conduction along that interface no longer dominates the overall subthreshold conduction of the transistor. The subthreshold characteristics of the transistor as a whole are thus responsive to the application of back bias, enabling back bias to minimize the overall level of off-state leakage and minimize flicker noise at low gate-to-source voltages.

As discussed above relative to FIGS. 1a and 1b, conventional MOS transistors that are vulnerable to subthreshold conduction along the isolation-to-active interface exhibit a large variance in that conduction, leading to poor device matching. This variance is due to the significant randomness of the density and distribution of charge trapping sites, which largely determines the conduction level. The reduction in the level of subthreshold conduction provided by embodiments of this invention therefore results in a much smaller variance in this conduction over a population of transistors, reducing the mismatch in off-state behavior within a given integrated circuit.

These important benefits are attained, in embodiments of this invention, while avoiding the difficulties presented by conventional approaches to the problem of subthreshold conduction at the isolation-to-active interface. As discussed above, one conventional approach uses a thicker gate dielectric "fence" at the isolation-to-active interface to reduce this conduction. But the processes required to form gate dielectric layers of differing thicknesses is necessarily complex and costly; in contrast, no differing gate dielectric thicknesses are necessary according to embodiments of this invention, which require only changes in photomask patterns. Furthermore, the subthreshold conduction characteristics of transistors formed according to embodiments of this invention are more tightly controllable than such characteristics of the conventional devices with the thicker gate dielectric fence. This improved controllability results from the inherently tighter control of the patterning of the overlapping gate structure edge, according to embodiments of this invention, as compared with the increased variability of the edges of thicker gate dielectric regions, especially for active regions of decreasing area. This improved precision at the gate level is attained from the availability of plasma etch for the gate material, as opposed to the process variation involved in the wet etches required for definition of the thicker gate dielectric fence edges.

Figure 1C:
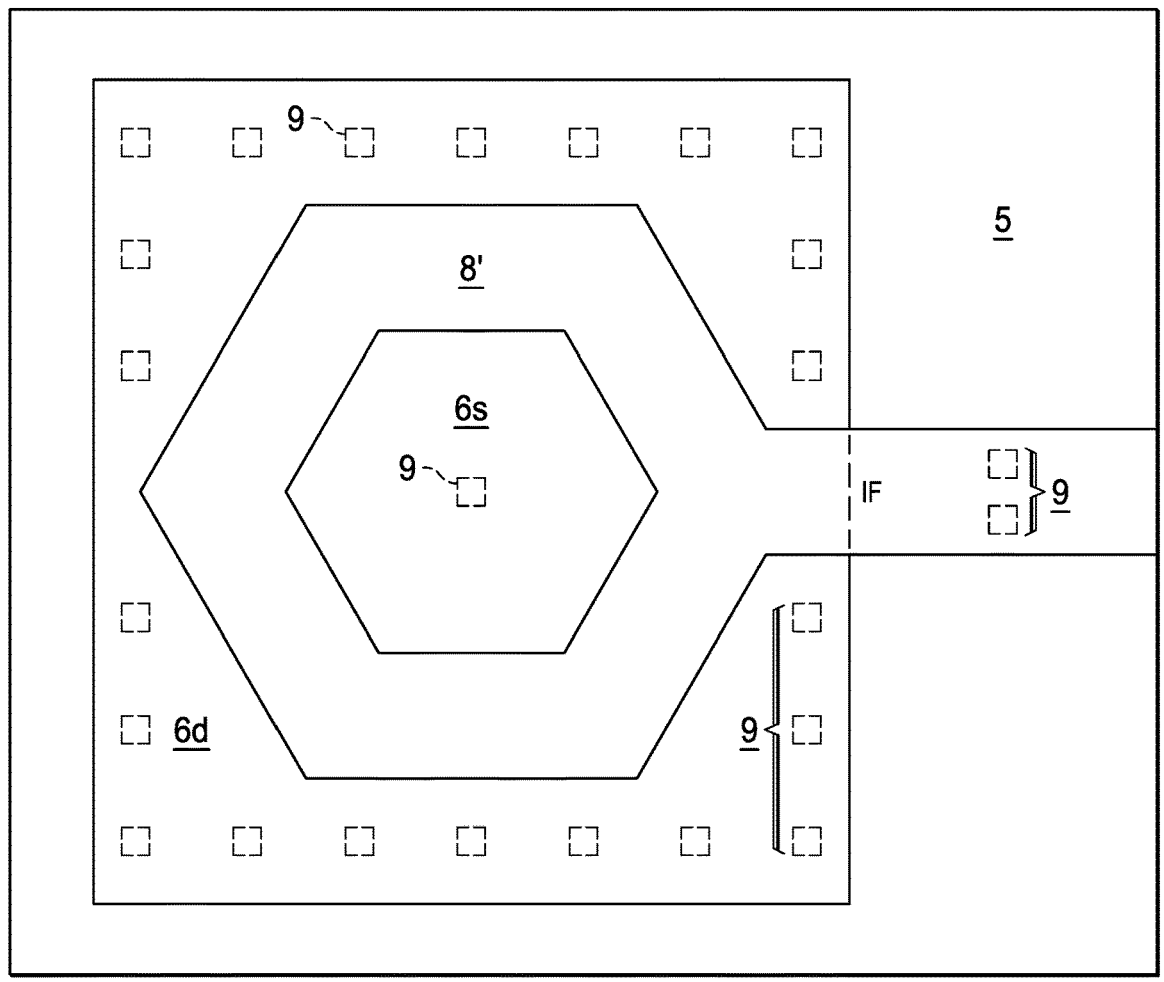

Transistors constructed according to embodiments of this invention also avoid the limitations of conventional "ring-FET" structures. More specifically, the chip area required for transistors according to this invention is much smaller than that required for ring-FET transistors of equivalent drive capability (W/L). In addition, the shape and orientation of the gate structures according to this invention avoid the complex geometry of the gate structure of a ring-FET, such as that shown in FIG. 1c. Ring-FET transistors are also more complex and difficult to model, scale, and implement in parameterized cells ("p-cells"); these complexities and difficulties are avoided according to embodiments of this invention. In contrast, according to embodiments of this invention, transistor gate structures can be constrained to be generally orthogonal (i.e., "north-south" or "east-west" in the layout) and rectangular, for which current conduction may be readily modeled by compact computer models that are scalable and that therefore provide a great deal of flexibility to the design process.

Referring back to FIG. 2b, the length and width of the on-state conduction channel of transistor 20 is essentially defined by gate width GW and gate length GL of central portion 28C of gate structure 28. This differs from conventional MOS transistors, such as that shown in FIG. 1a, in which the channel width is defined by the distance between opposing edges of the active region (i.e., the interfaces at isolation dielectric structures 5). For a given size of active region 23, therefore, overlap OV at opposing edges of active region 23 will effectively reduce the transistor channel width. To maintain the same channel width as a conventional transistor, therefore, the size of active region 23 will need to be increased, such that the interior edges of gate structure 28 at overlaps OV will essentially correspond to the location of interfaces IF of a conventional MOS transistor. This difference in layout may result in a chip area "penalty" relative to a conventional MOS transistor, but as mentioned above, this penalty will be much less than that involved in a ring-FET construction, and will be more uniform and matched over a population of transistors than that involved in a thicker gate dielectric "fence" construction.

Figure 3:
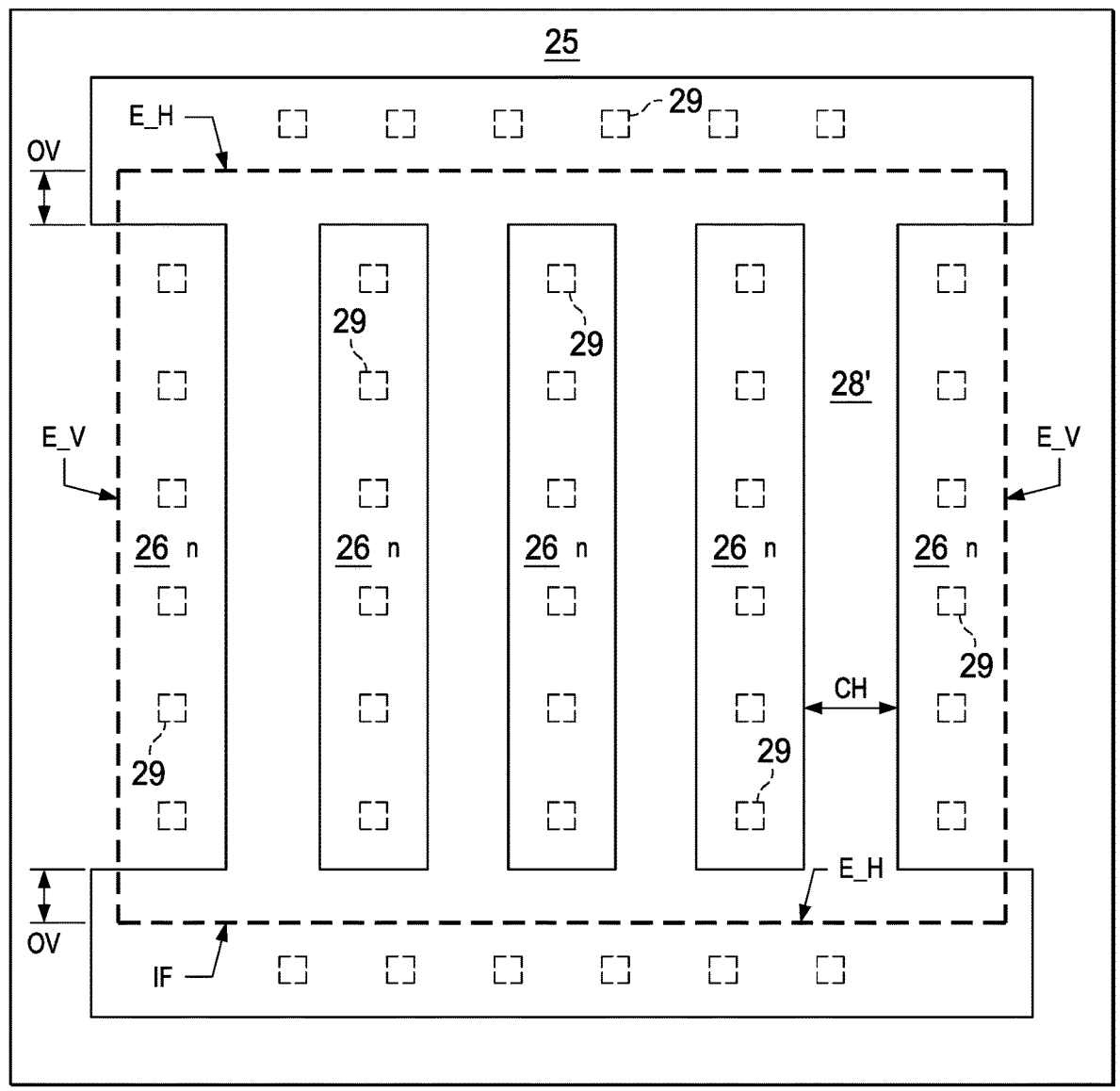
FIG. 3 is a plan view of a MOS transistor of large channel width constructed according to embodiments of this invention.

As evident from FIG. 1a, transistor 20 includes single central portion 28C that defines its channel width and channel length. Embodiments of this invention may be readily implemented into MOS transistors with larger channel widths, by providing multiple parallel central portions. FIG. 3 illustrates, in plan view, transistor 20W that includes gate structure 28' with four such central portions to define a significantly larger channel width, according to embodiments of the invention. Similarly as in the case of transistor 20 of FIG. 2b, gate structure 28' includes end portions that each overlap onto active region 23 (i.e., source/drain regions 26 and the surface of p-well 26 underlying gate structure 28) by overlap OV. Viewed in cross-section, the construction of transistor 20W is essentially identical to that shown in FIGS. 2c and 2d discussed above. Contact locations 29 to source/drain regions 26 and gate structure 28' are shown in FIG. 3, indicating the locations at which overlying metal conductors will make physical contact. Source/drain regions 26 will alternate between source and drain bias, thus defining transistor 20W as having a channel width four times that of transistor 20, resulting in four times the drive current capability relative to transistor 20, assuming otherwise equivalent device dimensions between the two. By virtue of overlap OV of gate structure 28' onto active region 23, transistor 20W enjoys similar benefits in reduced subthreshold conduction, response to back bias, and improved device matching, as described above relative to transistor 20 of FIG. 2b.

Figure 4:
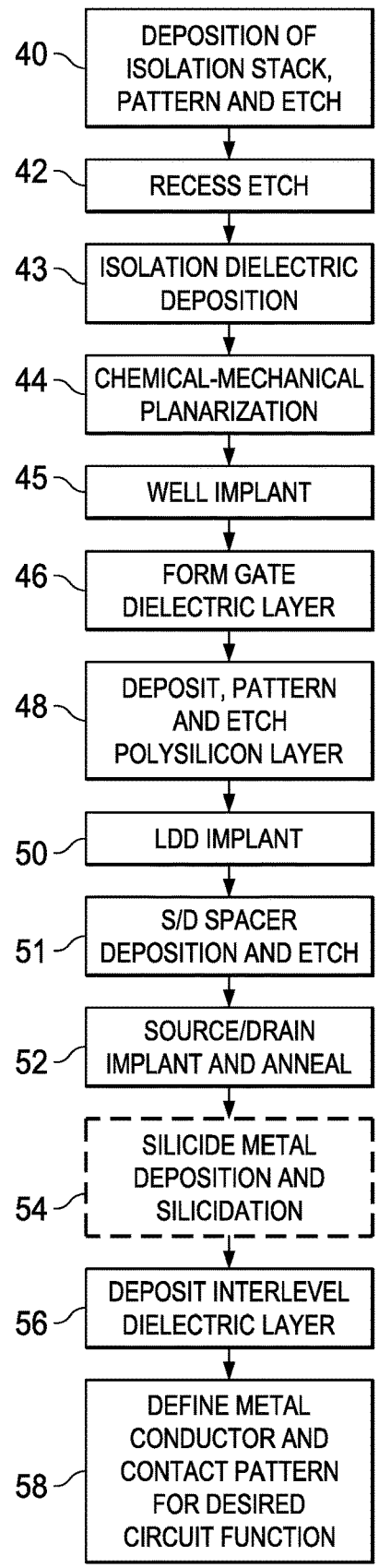
FIG. 4 is a flow diagram of the manufacturing process flow for fabricating MOS transistors according to embodiments of the invention.

Referring now to FIG. 4, a generalized process flow for the manufacture of an integrated circuit including transistors of the type described above relative to FIGS. 2a through 2d and 3, according to embodiments of this invention, will now be described. As will be evident to those skilled in the art having reference to this specification, alternative and additional processes, or both, may be incorporated into the particular process flow used to construct transistors according to this invention, without departing from the true scope of this invention. It is therefore to be understood that this description is provided by way of example only, with that example provided in a generalized manner.

It is to be further understood that transistors constructed according to embodiments of this invention may be either or both n-channel MOS and p-channel MOS devices, as desired for the particular circuit implementation and manufacturing technology. N-channel MOS transistors 20, 20W are shown and described herein by way of example only. Particular structures and layers referred to in this description correspond to those described above in connection with FIGS. 2a through 2d and 3.

The portion of the manufacturing flow shown in FIG. 4 begins with process 40, in which either or both of n-wells and p-wells (e.g., p-well 24) are formed at selected locations of substrate 22 in the conventional manner. As known in the art, n-type and p-type wells are each formed by way of photolithographic definition of the locations of the surface of substrate 22 at which the wells are to be located, followed by a masked ion implantation and activation anneal.

The reduction in subthreshold conduction at the isolation-to-active interface attained according to embodiments of the invention, enables isolation dielectric structures 25 to be of the shallow trench isolation (STI) type. Formation of STI isolation dielectric structures 25 begins with the deposition, pattern, and etch of an isolation stack, in process 40. This isolation stack, for example comprising an oxide pad over which silicon nitride is deposited, protects the eventual active regions of the surface of substrate 22. Process 40 also includes the patterning and etching of this isolation stack, to define the locations at the surface of substrate 22 at which isolation dielectric structures 25 are to be formed. In recess etch process 42, recesses of a desired depth are etched into the surface of substrate 22 at locations that are not protected by the remaining isolation stack (the protected locations becoming active regions 23 of the integrated circuit, e.g., as shown in FIG. 2a). In process 43, the exposed silicon in the etched recesses is oxidized to form a liner oxide film, followed by chemical vapor deposition of silicon dioxide or another dielectric material into the lined recesses. Typically the dielectric deposition overfills the etched recesses, and as such, chemical-mechanical planarization of the structure is performed in process 44, in the conventional manner, to remove oxide from over active regions 23 and to planarize the surface of the deposited dielectric in the recesses with the surface of the adjacent active regions 23; a nitride strip may be performed to remove the remaining nitride component of the isolation stack. Ion implantation to form p-well regions 24 (and n-wells if desired), and to adjust the threshold voltage of the eventual transistors (either or both of the n-channel and p-channel devices) is performed at this stage of manufacture in process 45, in the conventional manner.

In process 46, gate dielectric film 37 is then formed overall, either by thermal oxidation followed by optional nitridation or by chemical vapor deposition, depending on the desired material and properties of the transistor gate dielectric. Embodiments of this invention are also suitable for use with high-k dielectric materials, such as hafnium oxide. In any case, as described above, embodiments of this invention enable the formation of gate dielectric film 37 to a single thickness, with no need to form a thicker "fence" dielectric at the isolation-to-active interfaces IF of transistors in the integrated circuit.

According to embodiments of this invention, gate structures 28 are formed and defined at the desired locations of transistors 20, in process 48. For the example of a polysilicon gate structure, process 48 includes the deposition of polycrystalline silicon overall, followed by conventional photolithography and polysilicon etch. The photolithography of gate structures 28 may be performed in the conventional manner by the dispensing of photoresist overall, followed by conventional photolithographic patterning and developing, leaving photoresist mask elements at those locations of the polysilicon layer corresponding to gate structures 28. According to embodiments of this invention, as described above, this patterning of the gate material is performed using a photomask or reticle so as to define gate structures 28 having the desired shape and dimensions. More specifically, the gate structures defined by the patterning of process 48 have one or more central portions defining the transistor channel region, each contiguous with end portions that have overlap OV onto active regions 23 in the manner described above relative to FIGS. 2a through 2d and 3. The particulars of the distances of overlaps OV may depend on the particular transistors to be formed, including the circuit and physical locations of those devices within the integrated circuit. Process 48 completes definition of gate structures 28 by way of an etch of the polysilicon layer as protected by the patterned photoresist. As mentioned above, the etch of process 48 is preferably a plasma etch, for best precision.

Alternatively, gate structures 28 may be formed of a metal or metal compound, or of a composite of multiple material layers, as known in the art.

Transistors 20 are usually formed with lightly-doped drain extensions, as shown in FIGS. 2c and 2d. In process 50, drain extensions are formed by a shallow ion implant of opposite conductivity type as the underlying active region. These drain extensions are self-aligned with gate structure 28; an LDD spacer may be formed along the sidewalls to set back the drain extensions from the sides of the gate, if desired. Also in process 50, a "halo" implant may also be performed, typically as an angled implant of dopant of the same conductivity type as the channel region so as to reach under the edges of gate structure 28 and to establish the desired dopant profile. Sidewall dielectric spacers 31 are then formed in process 51 in the conventional manner, by deposition of the desired dielectric material (e.g., silicon nitride) overall, followed by an anisotropic etch to remove the dielectric material from flat surfaces, leaving sidewall spacers 31 on the side walls of gate structure 28. Of course, transistors 20 may be formed without such lightly-doped drain extensions, in which case processes 50, 51 will be omitted.

In either case (i.e., including or not including spacers 31 and the drain extension implant), source/drain ion implant is performed in process 52 at the desired dose and energy to define the dopant concentration in source/drain regions 26 of transistor 20. Gate structure 28, if formed of polysilicon, may also be doped by the source/drain implant, to ensure proper transistor operation and good conductivity. Process 58 also typically includes the desired activation anneal of the implanted species to the desired junction depth and concentration profile.

If the integrated circuit is a CMOS integrated circuit, source/drain implant and anneal process 52 (and, perhaps, optional process 50) will have been performed for transistors 20 of one channel conductivity type, with the locations of transistors 20 of the other channel conductivity type being masked from those processes. In this case, processes 50, 52 would then be repeated to form transistors of the other channel conductivity type, with the appropriate masking of those transistors 20 formed in the first pass of these processes.

As known in the art, optional silicidation process 54 may now be performed, to clad source/drain regions 26 and gate structures 28 with a metal silicide, for improved conductivity. Optional process 54 includes the deposition of a metal with which the silicide is to be formed, for example titanium, tungsten, tantalum, cobalt, nickel, platinum, and the like. After deposition of the metal layer, the structure is subjected to a high temperature anneal, also as part of process 54, to cause the deposited metal to react with such silicon material with which it is in contact, to form a metal silicide compound that dads the underlying structure.

An interlevel dielectric layer is then deposited overall in the conventional manner, in process 56. The integrated circuit is then completed, beginning with process 58 that includes the definition and etch of contacts and vias to underlying structures, followed by the deposition and patterning of the appropriate overlying metal conductors. Processes 56, 58 are repeated according to the number of conductor levels to be formed in the integrated circuit.

According to embodiments of this invention, therefore, the manufacturing process flow required to realize integrated circuits according to embodiments of this invention are fully compatible with conventional and existing state-of-the-art integrated circuit manufacturing process flows. No additional processing cost is necessarily invoked by implementation of embodiments of this invention, as no additional processes are necessary to reduce MOS subthreshold conduction according to embodiments of this invention.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A metal-oxide-semiconductor (MOS) transistor structure comprising:
   isolation dielectric structures disposed at a semiconducting surface of a body, the isolation dielectric structures defining an active region of the surface adjacent thereto, the active region having first and second parallel edges extending in a first direction, and third and fourth parallel edges extending in a second direction perpendicular to the first direction, wherein the isolation dielectric structures are shallow trench isolation (STI) structures;
   a p-type well formed in the active region of the semiconductor surface;
   a gate dielectric layer disposed over the active region; and
   a gate structure disposed over the gate dielectric layer at the active region, the gate structure extending onto isolation dielectric structures adjacent to the active region, the gate structure including sidewall spacers and the gate structure comprising:
      a plurality of central portions, each of the central portions disposed over the active region and extending in the second direction; and
      first and second end portions contiguous with the plurality of central portions, each end portion disposed upon the isolation dielectric structures adjacent to the active region, the first and second end portions overlapping the entire first edge and the entire second edge of the active region, wherein the first end portion is contiguous with each of the plurality of central portions at one end, and the second end portion is contiguous with each of the plurality of central portions at the other end, and wherein the plurality of central portions and the first and second end portions are formed of a single contiguous structure;
   source and drain regions of the active region disposed on opposite sides of the central portions, wherein the source and drain regions each include a lightly-doped region, and a heavily-doped region; and
   wherein each of the contiguous first and second end portions also overlaps the isolation dielectric structures at a portion of the third and fourth edges of the active region.

2. The transistor structure of claim 1, wherein the gate structure is selected from the group of doped polycrystalline silicon, a metal or a conductive metal compound composed of mix selected from titanium, tungsten, tantalum, titanium nitride, tantalum nitride or tungsten nitride.

3. The transistor structure of claim 1, wherein the gate structure comprises polycrystalline silicon.

4. The transistor structure of claim 1, wherein the gate structure comprises a material selected from the group consisting of a metal and a conductive metal compound.

5. The transistor structure of claim 1, wherein the isolation dielectric structures have upper surfaces substantially coplanar with the surface at the active region.

6. The transistor structure of claim 1, wherein each of the plurality of central portions of the gate structure has a width in the first direction, and wherein the first and second end portions overlap the first and second edges of the active region, respectively, to extend onto the active region by at least about 50% of the width of one of the central portions.

7. An integrated circuit having a metal-oxide-semiconductor (MOS) transistor structure comprising:
   an isolation dielectric structure disposed at a semiconducting surface of a body, the isolation dielectric structure defining an active region of the surface adjacent thereto, the active region having first and second parallel edges extending in a first direction, and third and fourth parallel edges extending in a second direction perpendicular to the first direction;
   a gate dielectric layer disposed over a portion of the active region; and
   a gate structure disposed over the gate dielectric layer at the active region, the gate structure extending onto the isolation dielectric structure adjacent to the active region, the gate structure including sidewall spacers and the gate structure comprising:
      a plurality of central portions, each of the central portions disposed over the active region and extending in the second direction; and
      first and second end portions contiguous with the plurality of central portions, the first and second end portions overlapping the entire first edge and the entire second edge of the active region, wherein the first end portion is contiguous with each of the plurality of central portions at one end, and the second end portion is contiguous with each of the plurality of central portions at the other end, and wherein the plurality of central portions and the first and second end portions are formed of a single contiguous structure, and wherein each of the contiguous first and second end portions also overlap the isolation dielectric structure at a portion of the third and fourth edges of the active region;

source and drain regions of the active region disposed on opposite sides of the central portion.

8. The transistor structure of claim 7, wherein the gate structure comprises polycrystalline silicon.

9. The transistor structure of claim 7, wherein the gate structure comprises a material selected from the group consisting of a metal and a conductive metal compound.

10. The transistor structure of claim 7, wherein the gate structure comprises a conductive metal compound composed of a mix selected from titanium, tungsten, tantalum, titanium nitride, tantalum nitride and tungsten nitride.

11. The transistor structure of claim 7, wherein the isolation dielectric structure has an upper surface substantially coplanar with the surface at the active region.

12. The transistor structure of claim 7, wherein each of the plurality of central portions of the gate structure has a width in the first direction, and wherein the first and second end portions overlap the first and second edges of the active region, respectively, to extend onto the active region by at least about 50% of the width of one of the central portions.

* * * * *